United States Patent
Lin et al.

(10) Patent No.: US 11,988,724 B2
(45) Date of Patent: *May 21, 2024

(54) SIGNAL DETECTOR

(71) Applicant: Hitron Technologies Inc., Hsinchu (TW)

(72) Inventors: Cheng-I Lin, Hsinchu (TW); Chiou-Hao Peng, Hsinchu (TW)

(73) Assignee: Hitron Technologies Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/135,872

(22) Filed: Dec. 28, 2020

(65) Prior Publication Data

US 2021/0208210 A1 Jul. 8, 2021

Related U.S. Application Data

(60) Provisional application No. 62/956,655, filed on Jan. 3, 2020.

(51) Int. Cl.
*G01R 31/58* (2020.01)
*H01B 11/18* (2006.01)
*H01R 13/66* (2006.01)

(52) U.S. Cl.
CPC ............. *G01R 31/58* (2020.01); *H01B 11/18* (2013.01); *H01R 13/6683* (2013.01)

(58) Field of Classification Search
CPC .... G01R 31/58; H01B 11/18; H01R 13/6683; H04N 17/04; H04N 5/50
See application file for complete search history.

(56) References Cited

U.S. PATENT DOCUMENTS

2021/0367641 A1* 11/2021 Abdelgadir .............. H04B 3/46

* cited by examiner

*Primary Examiner* — Akm Zakaria
(74) *Attorney, Agent, or Firm* — OPES IP Consulting Co. Ltd.

(57) ABSTRACT

The invention provides a signal detector. The signal detector comprises a housing, having a connector and a display unit; a tuner, configured to receive a cable signal; a microcontroller unit (MCU), electrically connected with the tuner and the display unit; a scanning switch, electrically connected with the MCU; a power supply, configured to supply a power to the MCU; and a power switch, electrically connected with the MCU.

9 Claims, 2 Drawing Sheets

SIGNAL DETECTOR

CROSS REFERENCE TO RELATED APPLICATION

The present application claims priority to U.S. Provisional Application Ser. No. 62/956,655, filed on Jan. 3, 2020, which are hereby incorporated by reference in their entirety.

FIELD

This invention relates to a signal detector, and more particularly, to a portable signal detector that is capable of detecting whether there is signal at a coaxial wall socket.

BACKGROUND

A cable modem is a type of Network Bridge that provides bi-directional data communication via radio frequency channels on a hybrid fibre-coaxial (HFC), radio frequency over glass (RFoG) and coaxial cable infrastructure. Taking advantage of the high bandwidth of a HFC and RFoG network, cable modems are primarily used to deliver broadband Internet access. Cable modems are commonly deployed in the Americas, Asia, Australia, and Europe.

When in use, cable modems are connected to a coaxial wall socket (or, RF outlet or RF cpax port), where coaxial signal is provided.

Conventional approaches to test if there is signal at a coaxial wall socket are either by plugging in a cable modem to see if it comes online or by using a technician meter. Subscribers usually do not have a meter that they could use to validate if there is signal at the coaxial wall socket. The only option left is to connect their cable modem and wait to see if it would come online.

Subscribers will not know if the problem is about the coaxial wall socket. If operator send a technician to the subscriber's premise to check if there's signal at the socket, the cost will be expansive. Further, every time a subscriber calls the operator's help desk, extra time and money are incurred, which ultimately causes a bad initial experience that may correlate to shortened customer retention.

SUMMARY OF THE DISCLOSURE

One of the purposes of the present invention is to provide a signal detector, for users to easily detect whether there is cable signal at a coaxial outlet. The signal detector includes a housing, having a connector and a display unit; a tuner, configured to receive a cable signal; a microcontroller unit (MCU), electrically connected with the tuner and the display unit; a scanning switch, electrically connected with the MCU, a power supply, configured to supply a power to the MCU and a power switch, electrically connected with the MCU.

Preferably, the power supply is implemented as a dry battery socket or a USB port.

Preferably, the display unit is an LED light.

Preferably, the connector is an F-type male connector.

Preferably, the F-type male connector is a 75 Ohm F-type male connector.

Preferably, the tuner scans a signal within a frequency range.

Preferably, wherein the frequency range is from 88 MHz to 1 GHz.

Preferably, the tuner scans the signal based on a scanning bandwidth.

Preferably, the scanning bandwidth is 6 MHz.

DETAILED DESCRIPTION

Unless defined otherwise, all technical and scientific terms used herein have the same meanings as commonly understood by one of skill in the art to which this disclosure belongs. It will be further understood that terms; such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
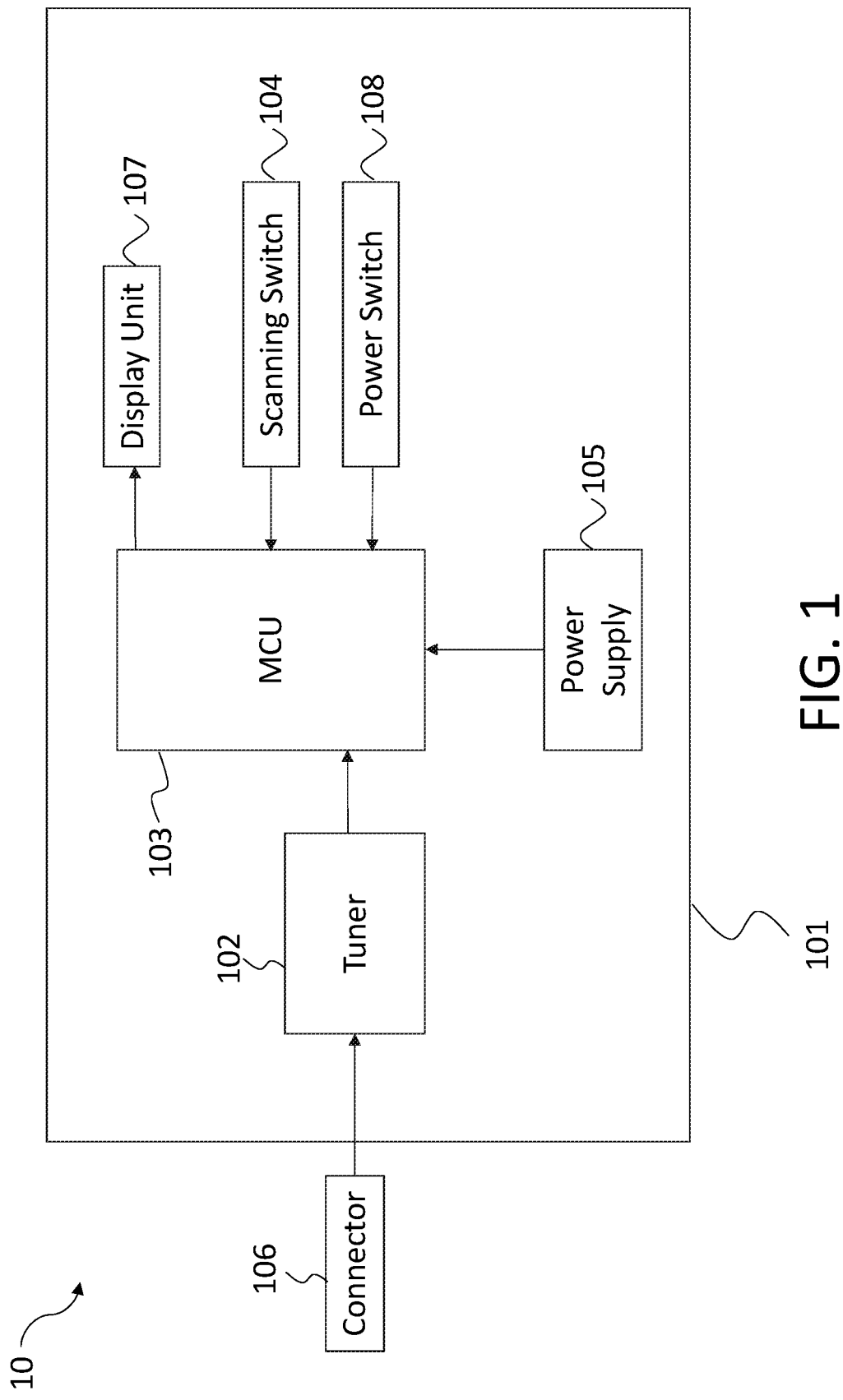
FIG. 1 illustrates the functional blocks of the signal detector according to the present invention.

Reference is made to FIG. 1, which illustrates the functional blocks of the signal detector according to the present invention. The signal detector 10 includes a housing 101, a tuner 102, a microcontroller unit (MCU) 103, a scanning switch 104 and a power supply 105.

The housing 101 has a connector 106 and a display unit 107. The tuner 102 is configured to search (or to scan, to detect) for cable signals, and the MCU 103 electrically connects with the tuner 102 and the display unit 107. Further, the scanning switch 104 electrically connects with the MCU 103, and the power supply 105 is configured to supply a power to the MCU 103. The signal detector 10 also includes a power switch 108, and the power switch 108 is electrically connected to the MCU 103.

When the signal detector 10 is used by a user, the user firstly turns the signal detector's 10 power on, which is by pressing the power switch 108 according to the present embodiment of the present invention. The implementation for the power switch 108 may be adjusted by people with ordinary skill in the art, to fit for different practical demands. Thus, the implementation of the power switch 108 should not limit the scope of the present invention.

The display unit 107 in the present embodiment is implemented as an LED light, which may flash three colors of light, including white, green and red. After the signal detector 10 is turned on, the LED light flashes out white light to indicate the current status of the signal detector 10.

The user then presses the scanning switch 104. After pressing the scanning switch 104, the display unit 107 starts to flash green light. It is worth to note that, if the scanning switch 104 is not pressed within a predetermined time period after the power switch 108 is pressed, the signal detector 10 will return to sleep mode to save power. The predetermined period may be adjusted accordingly. In the present embodiment, the predetermined period is twenty seconds.

Assuming that the scanning switch 104 is pressed within twenty seconds after the power switch 108 is pressed, the user then places the signal detector 10 into a coaxial socket (not shown in the figure), by inserting the connector 106 into the coaxial socket. In the present embodiment, the connection 106 is implemented as an F-type male connector. Preferably, the F-type male connector is a 75 Ohm F-type male connector. However, such specific type of connector should be limit the scope of the present invention. It can be understood that the connector may be modified by people with ordinary skill in the art to fit with different practical demands.

Since the connector 106 is implemented as an F-type male connector, it can be directly inserted into a coaxial wall socket, rather than a screwing connector as implemented for traditional connector. Such F-type male connector 106 may save more time comparing to traditional screw type connector, and makes the insertion more readily.

As previously described, after the scanning switch 104 is pressed, the MCU 103 will receive a signal indicating the scanning switch 104 status, the MCU 103 will then controls the tuner 102 to start scanning (or detecting, searching) cable signal. Before any scanning result is determined by the MCU 103, the display unit 107 remain flashing green light. It can also be understood that if the display unit 107 is flashing green light, then the signal detector 10 is under scanning operation.

The tuner 102 will pass all the scanning result to the MCU 103, for the MCU 103 to determine whether the signal collected belongs to coaxial cable signal. The MCU 103, based on signal intensity, to determine whether the signal collected belongs to coaxial cable signal. To be more specific, if the MCU 103 detects that the signal intensity for the detected signal falls within −15 dBmV to +15 dBmV, then the MCU 103 determines that the signal belongs to coaxial cable signal. In such scenario, the MCU 103 controls the display unit 107 to display constant green light. Otherwise, the MCU 103 controls the display unit 107 to display red light.

The user can, by the light flashed or displayed by the display unit 107, easily interpret either what operation mode the signal detector 10 is currently under, and whether if there's coaxial cable signal at the socket.

Figure 2:
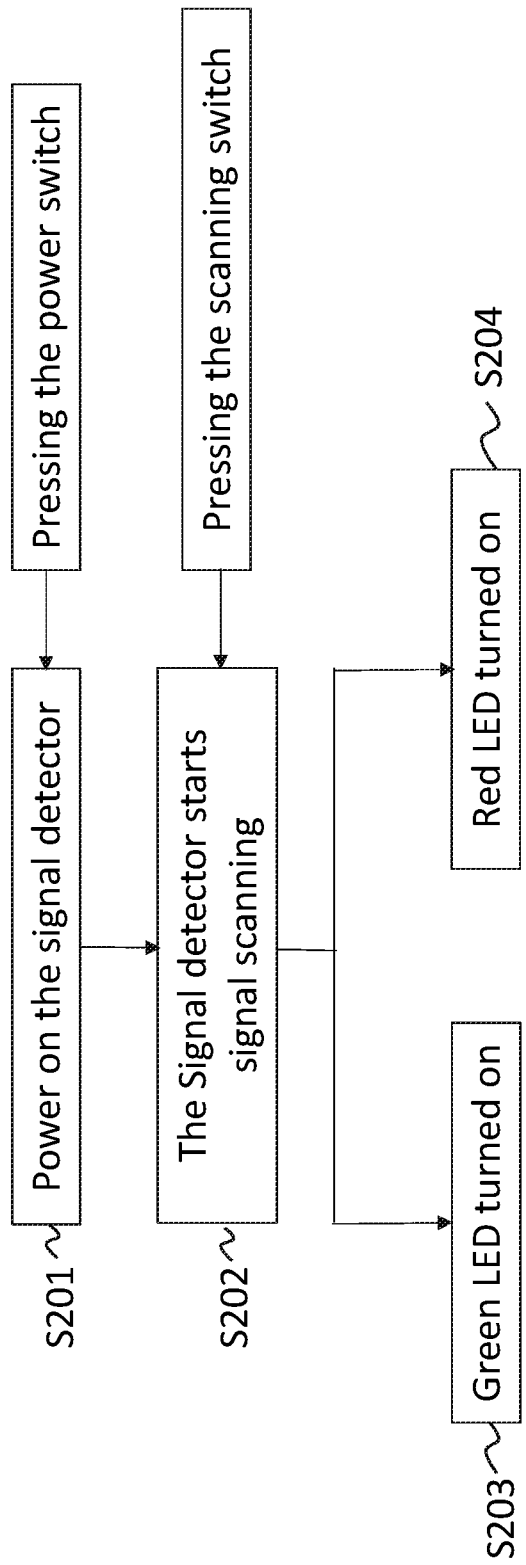
FIG. 2 illustrates the working flowchart of the signal detector according to the present invention.

Reference is collectively made to FIG. 2, which illustrates the working flowchart of the signal detector according to the present invention. Referring to FIG. 2, in step S201, power on the signal detector 10. It can also be understood that, a user, when using the signal detector 10, firstly presses the power switch 108 to power on the signal detector 10.

After the signal detector 10 is powered on, the MCU 103 controls the display unit 107, which is embodied as an LED light in the present embodiment, to display white light. Within a predetermined time period, the scanning switch 104 must be pressed, or the signal detector 10 will turn to sleep mode and the display unit 107 will be turned off (by MCU 103). The predetermined period may be adjusted accordingly. In the present embodiment, the predetermined period is thirty seconds.

Assuming that the scanning switch 104 is pressed within thirty seconds after the power switch 108 is pressed, the user then places the signal detector 10 into a coaxial socket, by inserting the connector 106 into a coaxial socket. In the present embodiment, the connection 106 is implemented as an F-type male connector. Preferably, the F-type male connector is a 75 Ohm F-type male connector. However, such specific type of connector should be limit the scope of the present invention. It can be understood that the connector may be modified by people with ordinary skill in the art to fit with different practical demands.

Next, in step S202, the signal detector 10 starts signal scanning. The signal detector 10 starts to scanning signal after the scanning switch 104 is pressed. The scanning switch 104 is connected with the MCU 103, therefore, after the MCU 103 detects that the scanning switch 104 is pressed, the MCU 103 controls the tuner 102 to start scanning signals, and controls the display unit 107 to flash green light. It is worth to note that the flashing green light indicates that the tuner 102 is scanning (or searching, or detecting) for signals.

After the tuner 102 starts to scan cable signals, the tuner 102 will pass all the signals scanned to the MCU 103 for further processing. The MCU 103 then determines if cable signal exists according the signal intensity. If the MCU 103 detects cable signal, the MCU 103 controls the display unit 107 (i.e., the LED light) to turn displaying green light constantly from flashing green light, as shown in step S203. However, if the MCU 103 determines no signal is detected (e.g., signal intensity blow certain threshold), the MCU 103 controls the display unit 107 to display red light, as shown in step S204.

The power supply 105 may implemented as a dry battery socket or a USB port. It is worth to note that people with ordinary skill in the art may adopt other kinds of implementation for the power supply 105 based on various practical demands. However, in the present embodiment, the power supply 105 is implemented as a dry battery socket, and is able to provide direct current with 3.3V for the MCU 103 and the tuner 102.

The MCU 103 and the tuner 102 are two respective integrated circuit (ICs). The two ICs may be installed on a printed circuit board (PCB). The MCU 103 is in charge of software operation. It can also be interpreted that the MCU 103 wakes the tuner 102 up for single scanning after the scanning switch 104 is pressed. The MCU 103 communicates with the tuner 102 through I2C, which is a standard communication interface. However, the communication between the MCU 103 and the tuner 102 is not limited to I2C only. Other communication protocols may also be used in the present invention.

When the tuner 102 is awaken, the MCU 103 further controls the display unit 107 to flash green light, as described above. If the MCU 103 determines that there's cable signal detected, the flashing green light will be turned to constant green light. However, if the MCU 103 determines that there's no signal detected, the MCU 103 controls the display unit 107 to display red light.

Further, for the signal detector 10 of the present invention, if the power switch is pressed 108, but the scanning switch 104 is not pressed within the next ten seconds, the signal detector 10 will then turn to sleep mode. Such design may save more power for the signal detector 10. The ten seconds waiting duration may be adjusted by people with ordinary skill in the art according to different practical demands. The waiting duration may be, for example, five seconds, eight seconds and etc.

The tuner 102 is designed to detect signals within a specific frequency range. In the present embodiment, the frequency range is between 88 MHz to 1 GHz. Further and scanning bandwidth is designed to be 6 MHz. That is to say, if the first scanning is performed at 88 MHz, the next scanning will be 104 MHz, and the next will be 110 MHz, and so on. The scanning frequency bandwidth may also be adjusted by people with ordinary skill in the art to fit different practical demands. Therefore, the 6 MHz as described here should not be limiting the scope of the present invention. Since the 6 MHz scanning frequency bandwidth is applied in the present invention, the total channels on cable is 152 ((1000−88)/6).

Further, according to definition, the signal intensity for cable signal is defined between −15 dBmV to +15 dBmV. Therefore, if the signal detected by the MCU 103 falls within the −15 dBmV to +15 dBmV range, the MCU 103 will then controls the display unit 107 to display green light.

Further, a detection duration may be set to be five seconds. To be more specific, after the scanning switch 104 is pressed and the tuner 102 starts to scanning for cable signal for five seconds. If, within five second, a cable signal is detected, the MCU 103 controls the display unit 107 to display green light. However, if no cable signals are detected within five seconds, the MCU 103 controls the display unit 107 to display red light. The detection duration may be adjusted accordingly by people with ordinary skill in the art, to fit for different practical demands. Thus, the five second detection duration of the present embodiment should not limit the scope of the present invention.

A summary for LEDs behavior may be given accordingly. That is, if the display unit 107 displays white light, it means that the signal detector 10 is turned. If the display unit 107 flashes green light, it means that the signal detector 10 is scanning for cable signal. If the display unit 107 displays constant green light, it means that cable signal is detected. If the display unit 107 displays red light, it means that no cable signals are detected.

A scenario is described in the following paragraph to help illustrate the advantages of the present invention. A user buys a telephone device from a retail store for electronic devices, plugs the wire of the telephone device into a socket on a wall of the user's domicile, but finds the telephone device is not functioning after the wire is plugged into the socket.

The user calls the customer service centre for help, reporting the issue of the newly-bought telephone device not being function properly, and ask for a technician to come over. The telephone seller sends a technician to the user's domicile to deal with the problem. The technician finds the issue is not with the telephone device itself, but the socket. The technician discovery that there's not signal can be detected at the socket, because the user does not apply for a telephone number from an operator, so that even a telephone device is plugged with the socket, the telephone device cannot be used still.

In certain countries with smaller areas, technical can be sent to the scene within 2-3 hours, even within a couple minutes. However, for some countries with broader areas, sending a technician to the scene can be burdensome.

That is, the present invention provides user with a solution for user to take care of the issue as described above readily. Simply by using the present invention, the user can easily detect whether there's signal at the socket, the user can thus accordingly determine where the problem is resulted from, and tackle the problem with proper approach.

In sum, a signal detector is provided in the present invention. The signal detector provides user for unsophisticatedness to detect whether there is cable signal at a coaxial outlet. Simply by placing the signal detector into a coaxial socket and turning on the detector, it will detect if there is coaxial signal within certain frequency range. If yes, a green light will be shown to indicate the presence of the signal. A red light indicates otherwise.

In sum, the present invention provides a signal detector for detecting cable signals. The signal detector can be made small, so as to be carried easily and conveniently. The size of the signal detector may be smaller than a human palm. Moreover, the signal detector utilize direct circuit as power supply. The operation of the signal detector is simple, so that cable signal detection can be easily performed without the present of professional technician.

Further, the signal detector as provided by the present invention also possesses the feature of low power consumption. To be more specific, when the signal detector is just turned, the power consumed is about 0.13 Watt. When the signal detector is under sleep mode, the power consumption is about 0.099 Watt. And when the signal detector is scanning for cable signal, the power consumed is about 0.79 Watt.

The invention claimed is:

1. A signal detector, comprising:
   a housing, having a connector and a display unit;
   a tuner, configured to receive a cable signal;
   a microcontroller unit (MCU), electrically connected with the tuner and the display unit;
   a scanning switch, electrically connected with the MCU;
   a power supply, configured to supply a power to the MCU; and
   a power switch, electrically connected with the MCU.

2. The signal detector of claim 1, wherein the power supply is implemented as a dry battery socket or a USB port.

3. The signal detector of claim 1, wherein the display unit is an LED light.

4. The signal detector of claim 1, wherein the connector is an F-type male connector.

5. The signal detector of claim 4, wherein the F-type male connector is a 75 Ohm F-type male connector.

6. The signal detector of claim 1, wherein the tuner scans a signal within a frequency range.

7. The signal detector of claim 6, wherein the frequency range is from 88 MHz to 1 GHz.

8. The signal detector of claim 6, wherein the tuner scans the signal based on a scanning bandwidth.

9. The signal detector of claim 6, wherein the scanning bandwidth is 6 MHz.

* * * * *